(12) United States Patent
De Boer et al.

(10) Patent No.: US 9,395,636 B2
(45) Date of Patent: Jul. 19, 2016

(54) LITHOGRAPHY SYSTEM FOR PROCESSING A TARGET, SUCH AS A WAFER, AND A METHOD FOR OPERATING A LITHOGRAPHY SYSTEM FOR PROCESSING A TARGET, SUCH AS A WAFER

(75) Inventors: Guido De Boer, Leerdam (NL); Niels Vergeer, Rotterdam (NL); Godefridus Cornelius Antonius Couweleers, Delft (NL); Laurens Plandsoen, Delft (NL); Cor Verburg, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 777 days.

(21) Appl. No.: 13/453,994

(22) Filed: Apr. 23, 2012

(65) Prior Publication Data

US 2012/0268725 A1    Oct. 25, 2012

Related U.S. Application Data

(60) Provisional application No. 61/478,126, filed on Apr. 22, 2011, provisional application No. 61/491,862, filed on May 31, 2011, provisional application No. 61/486,165, filed on May 13, 2011, provisional (Continued)

(51) Int. Cl.
*G03B 27/58* (2006.01)
*G03B 27/54* (2006.01)
(Continued)

(52) U.S. Cl.
CPC ............ *G03F 9/7088* (2013.01); *G03F 7/7085* (2013.01); *G03F 7/70616* (2013.01); *G03F 7/70666* (2013.01); *G03F 7/70775* (2013.01)

(58) Field of Classification Search
CPC ............ G03F 7/70616; G03F 7/70666; G03F 7/70683; G03F 7/70775; G03F 7/70758; G03F 7/70825; G03F 7/7085; G03F 7/70858; G03F 7/7095; G03F 7/70958; G03F 9/7088; G03F 9/7096; G03F 7/2037; G03F 7/2059
USPC ........... 355/30, 52, 53, 55, 67–71, 72–75, 77; 250/492.1, 492.2, 492.22, 493.1, 548, 250/492.21, 492.3; 430/5, 8, 22, 30, 311, 430/312, 321
See application file for complete search history.

(56) References Cited

U.S. PATENT DOCUMENTS

| 3,935,497 A | 1/1976 | Cowles |
| 4,251,160 A | 2/1981 | Bouwhuis et al. |

(Continued)

FOREIGN PATENT DOCUMENTS

| CN | 1495540 | 5/2004 |
| CN | 1577080 | 2/2005 |

(Continued)

OTHER PUBLICATIONS

Reich, C et al. "3-D shape measurement of complex objects by combining photogrammetry and fringe projection", Optical Engineering, Jan. 2000, p. 224-231, vol. 39 No. 1.

(Continued)

*Primary Examiner* — Christina Riddle
(74) *Attorney, Agent, or Firm* — Blakely Sokoloff Taylor & Zafman LLP

(57) ABSTRACT

The invention relates to a lithography system for processing a target, such as a wafer. The lithography system comprises a beam source arranged for providing a patterning beam, a final projection system arranged for projecting a pattern on the target surface, a chuck arranged for supporting the target and a mark position system connected to the final projection system and arranged for detecting a position mark on a surface.

12 Claims, 7 Drawing Sheets

Related U.S. Application Data application No. 61/491,867, filed on May 31, 2011, provisional application No. 61/486,167, filed on May 13, 2011, provisional application No. 61/491,866, filed on May 31, 2011.

(51) Int. Cl.
  *G03F 9/00* (2006.01)
  *G03F 7/20* (2006.01)

(56) References Cited

U.S. PATENT DOCUMENTS

| | | |
|---|---|---|
| 4,631,416 A | 12/1986 | Trutna, Jr. |
| 4,701,606 A | 10/1987 | Tanimoto et al. |
| 4,716,441 A | 12/1987 | Ogawa |
| 4,861,162 A | 8/1989 | Ina |
| 4,967,088 A | 10/1990 | Stengl et al. |
| 5,243,195 A | 9/1993 | Nishi |
| 5,477,057 A | 12/1995 | Angeley et al. |
| 5,557,411 A | 9/1996 | Houryu et al. |
| 5,594,549 A | 1/1997 | Mori et al. |
| 5,644,137 A | 7/1997 | Waggener |
| 5,706,091 A | 1/1998 | Shiraishi |
| 5,721,605 A | 2/1998 | Mizutani |
| 5,745,242 A | 4/1998 | Hata |
| 5,783,833 A | 7/1998 | Sugaya et al. |
| 5,827,629 A | 10/1998 | Miyatake |
| 5,861,944 A * | 1/1999 | Nishi ................. 355/68 |
| 5,912,726 A * | 6/1999 | Toguchi et al. ........... 355/53 |
| 5,929,454 A | 7/1999 | Muraki et al. |
| 5,943,135 A | 8/1999 | Mishima |
| 6,266,130 B1 | 7/2001 | Hasegawa et al. |
| 6,429,943 B1 | 8/2002 | Opsal et al. |
| 6,459,473 B1 | 10/2002 | Chang et al. |
| 6,469,793 B1 | 10/2002 | Stanton |
| 6,522,411 B1 | 2/2003 | Moon et al. |
| 6,525,802 B1 | 2/2003 | Novak |
| 6,563,573 B1 | 5/2003 | Morohoshi et al. |
| 6,583,430 B1 | 6/2003 | Muraki |
| 6,674,510 B1 * | 1/2004 | Jasper et al. .............. 355/55 |
| 6,864,493 B2 | 3/2005 | Sato et al. |
| 7,116,626 B1 | 10/2006 | Woods et al. |
| 7,177,457 B2 | 2/2007 | Adel et al. |
| 7,474,410 B2 | 1/2009 | Moon |
| 2002/0020820 A1 | 2/2002 | Muraki |
| 2002/0043163 A1 | 4/2002 | Novak |
| 2003/0020184 A1* | 1/2003 | Ballarin ................... 257/797 |
| 2004/0059540 A1 | 3/2004 | Matsumoto et al. |
| 2004/0066518 A1 | 4/2004 | Kreuzer |
| 2004/0130690 A1 | 7/2004 | Koren et al. |
| 2004/0156026 A1* | 8/2004 | Kamiya ............ G03F 7/70775 355/30 |
| 2004/0165195 A1 | 8/2004 | Sato |
| 2005/0002004 A1 | 1/2005 | Kolesnychenko et al. |
| 2005/0029981 A1 | 2/2005 | del Puerto |
| 2005/0031969 A1 | 2/2005 | Finders et al. |
| 2005/0069790 A1 | 3/2005 | Gruss et al. |
| 2006/0011869 A1* | 1/2006 | Tanaka ............... B82Y 10/00 250/492.22 |
| 2006/0058972 A1* | 3/2006 | Kok et al. ............... 702/56 |
| 2006/0103845 A1 | 5/2006 | Tanaka et al. |
| 2006/0138359 A1 | 6/2006 | Maeda |
| 2006/0139660 A1 | 6/2006 | Patrick Kwan |
| 2006/0192931 A1 | 8/2006 | Roberts et al. |
| 2006/0279735 A1 | 12/2006 | Van Haren et al. |
| 2007/0041015 A1 | 2/2007 | Van Bilsen |
| 2007/0114678 A1 | 5/2007 | Van Haren et al. |
| 2007/0132996 A1 | 6/2007 | Van Haren et al. |
| 2007/0234786 A1 | 10/2007 | Moon |
| 2007/0247640 A1* | 10/2007 | Magome et al. ............ 356/609 |
| 2007/0260419 A1* | 11/2007 | Hagiwara .................. 702/150 |
| 2008/0018897 A1 | 1/2008 | Littau |
| 2008/0074629 A1 | 3/2008 | Groeneveld et al. |
| 2008/0083881 A1 | 4/2008 | Gorrell et al. |
| 2008/0084547 A1 | 4/2008 | Tokuday |
| 2008/0123203 A1 | 5/2008 | Onuki et al. |
| 2008/0151228 A1 | 6/2008 | Hugers |
| 2008/0165368 A1 | 7/2008 | Matsumoto |
| 2008/0240501 A1* | 10/2008 | Van Der Wijst et al. ...... 382/103 |
| 2008/0266560 A1 | 10/2008 | Kok |
| 2008/0291413 A1* | 11/2008 | Steijaert et al. .............. 355/53 |
| 2008/0316445 A1 | 12/2008 | Watson et al. |
| 2009/0002663 A1 | 1/2009 | Freimann et al. |
| 2009/0061331 A1 | 3/2009 | Nakano |
| 2009/0115983 A1 | 5/2009 | Stavenga et al. |
| 2009/0153861 A1 | 6/2009 | Musa et al. |
| 2009/0176167 A1 | 7/2009 | Hulsebos et al. |
| 2009/0195763 A1 | 8/2009 | Butler et al. |
| 2009/0237637 A1 | 9/2009 | Warnaar et al. |
| 2009/0290139 A1 | 11/2009 | Van der Sijs |
| 2010/0091259 A1 | 4/2010 | Koizumi |
| 2010/0245848 A1 | 9/2010 | Sakamoto |
| 2011/0013171 A1 | 1/2011 | Mueller et al. |
| 2011/0090476 A1 | 4/2011 | Van de Kerkhof |
| 2011/0102753 A1 | 5/2011 | Van De Kerkhof et al. |
| 2012/0026479 A1 | 2/2012 | Hembacher et al. |
| 2012/0050709 A1 | 3/2012 | Van der Pasch et al. |
| 2012/0242969 A1 | 9/2012 | Van der Pasch et al. |
| 2012/0268725 A1 | 10/2012 | de Boer et al. |
| 2014/0168625 A1 | 6/2014 | Ito |
| 2015/0109598 A1 | 4/2015 | Vergeer |

FOREIGN PATENT DOCUMENTS

| | | |
|---|---|---|
| CN | 101114135 | 1/2008 |
| CN | 101551593 | 10/2009 |
| EP | 0698826 A | 2/1996 |
| EP | 0999475 | 5/2000 |
| EP | 1061561 | 12/2000 |
| EP | 1076264 A | 2/2001 |
| EP | 1091385 | 4/2001 |
| EP | 1111473 A | 6/2001 |
| EP | 1148390 | 10/2001 |
| EP | 1265271 | 12/2002 |
| EP | 1434103 | 6/2004 |
| EP | 1491966 | 12/2004 |
| EP | 1674937 | 6/2006 |
| EP | 1975981 | 10/2008 |
| JP | H0497513 | 3/1992 |
| JP | H06302498 | 10/1994 |
| JP | H07074082 | 3/1995 |
| JP | H07221166 | 8/1995 |
| JP | H0982626 | 3/1997 |
| JP | 2001358068 | 12/2001 |
| JP | 2002190438 | 7/2002 |
| JP | 2003037036 | 2/2003 |
| JP | 2005057222 | 3/2005 |
| JP | 2006339647 | 12/2006 |
| JP | 2007142419 | 6/2007 |
| JP | 2008171960 | 7/2008 |
| JP | 2009277678 | 11/2009 |
| WO | 9839689 A | 9/1998 |
| WO | WO-03033199 | 4/2003 |
| WO | 2005010618 A | 2/2005 |
| WO | WO-2006009188 | 1/2006 |
| WO | 2007032670 A | 3/2007 |
| WO | 2007038134 A | 4/2007 |
| WO | WO-2007077925 | 7/2007 |
| WO | WO-2008037496 | 3/2008 |
| WO | WO-2008126925 | 10/2008 |
| WO | WO-2010032224 | 3/2010 |
| WO | WO-2010087352 | 8/2010 |

OTHER PUBLICATIONS

Buydens, L et al. "Amplitude modulation and beam-steering properties of active binary phase gratings with reconfigurable absorption areas", Applied Optics, Jul. 20, 1994, p. 4792-4800, vol. 33, No. 21.

Lalanne, P et al. "Antireflection behavior of silicon subwavelength periodic structures for visible light", Nanotechnology, 1997, p. 53-56, vol. 8.

(56) References Cited

OTHER PUBLICATIONS

Robledo-Sanchez, C et al. "Binary grating with variable bar-space ratio following a geometrical progression", Optics Communications, 1995, p. 465-470, vol. 119.

Davis, J A et al. "Encoding amplitude and phase information onto a binary phase-only spatial light modulator", Applied Optics, Apr. 10, 2003, p. 2003-2008, vol. 42, No. 11.

Davis, J A et al. "Encoding amplitude information onto phase-only filters", Applied Optics, Aug. 10, 1999, p. 5004-5013, vol. 38, No. 23.

Takeda, M et al. "Fourier transform profilometry for the automatic measurement of 3-D object shapes", Applied Optics, Dec. 15, 1983, p. 3977-3982, vol. 22, No. 24.

Print of Internet publication "Improved Overlay for ASML Systems", downloaded on Sep. 1, 2007 from http://www.asml.com/asmldotcom/show.do?ctx=9976&rid=9991.

Collischon, M et al. "Optimized artificial index gratings", Infrared Physics & Technology, 1995, p. 915-921, vol. 36.

Leray, P et al. "Overlay Metrology for Double Patterning Processes", Proceedings of SPIE, vol. 7272 72720G-1, doi: 10.1117/12.814182.

Fuller, L. "Wafer alignment for Canon Stepper", downloaded from http://people.rit.edu/lffeee/align.pdf, 2008.

Tao, W et al. "Novel fast and accurate correlation-tracking algorithm", Oct. 8, 1996, translation by National Air Intelligence Center NAIC-ID(RS)T-0408-96.

Fuller, L., et al., "Introduction to ASML PAS 5500 Wafer Alignment and Exposure," Nov. 10, 2011, Rochester Institute of Technology Microelectronic Engineering, p. 1-47.

Final Office Action in U.S. Appl. No. 13/453,986 dated Jul. 16, 2015. 15 pages.

Non-Final Office Action in U.S. Appl. No. 13/470,234 dated Jun. 30, 2015. 14 pages.

Notice of Allowance in U.S. Appl. No. 13/453,989 dated Jul. 30, 2015. 17 pages.

Durnin, J. "Exact Solutions for Nondiffracting Beams I. The Scalar Theory." J. Opt. Soc. Am. A. vol. 4, No. 4. Apr. 1987. pp. 651-654. 4 pages.

Notice of Allowance in U.S. Appl. No. 13/453,986 mailed Nov. 24, 2015. 14 pages.

INA. Aberration Evaluation of Alignment Optics in Lithographic Tools by Use of a Step-Height Structure Highly sensitive to the Asymmetry of an Optical Image. Applied Optics, vol. 46, No. 17. pp. 3485-3492 (Jun. 10, 2007). 8 pages.

Japanese Office Action with English Language Translation, dated Mar. 1, 2016, Japanese Application No. 2014-506356.

* cited by examiner

LITHOGRAPHY SYSTEM FOR PROCESSING A TARGET, SUCH AS A WAFER, AND A METHOD FOR OPERATING A LITHOGRAPHY SYSTEM FOR PROCESSING A TARGET, SUCH AS A WAFER

This is a non-provisional application claiming the benefit of U.S. Provisional Application No. 61/478,126, filed Apr. 22, 2011, U.S. Provisional Application No. 61/491,862, filed May 31, 2011, U.S. Provisional Application No. 61/486,165, filed May 13, 2011, U.S. Provisional Application No. 61/491,867, filed May 31, 2011, U.S. Provisional Application No. 61/486,167, filed May 13, 2011, and U.S. Provisional Application No. 61/491,866, filed May 31, 2011.

The invention relates to a lithography system for processing a target, such as a wafer, and a method for operating a lithography system for processing a target, such as a wafer.

Systems for processing a target are known in the art, usually comprising a final projection system for projecting a pattern on the target surface and a system for determining the position of a wafer with respect to the final projection system. In general, these systems may use position marks on the wafer. Between a first and a second session of projecting a pattern, it may be required to remove wafer from the lithography system. In that case, it may be required that the position of the pattern of the second session is matched with the position of the pattern of the first session and that the position of the wafer with respect to the final projection system (or the patterning beam) may have to be determined twice, at the beginning of each session. However, it may be difficult to determine the position of the wafer with respect to the final projection system with a high reproducibility.

It is an object of the present invention to provide an improved lithography system and method for processing a target, such as a wafer.

SUMMARY OF THE INVENTION

The object of the present invention is met by providing a lithography system for processing a target, such as a wafer, the target comprising a target surface, the lithography system comprising
- a beam source arranged for providing a patterning beam, preferably a light beam or a charged particle beam, such as an electron beam, the beam preferably comprising at least two beamlets;
- a final projection system arranged for projecting a pattern on the target surface with said patterning beam;
- a chuck arranged for supporting the target, wherein the chuck comprises a beam measurement sensor and a chuck surface provided with at least one chuck position mark thereon, the beam measurement sensor being arranged for measuring beam properties of the patterning beam, the beam properties comprising a spatial distribution of an intensity of the patterning beam and/or preferably a spatial distribution of the at least two beamlets;
- an actuator system arranged for moving the chuck in at least one dimension with respect to the final projection system;
- a chuck position sensor system, arranged for measuring the position of the chuck with respect to the final projection system in chuck position coordinates; and,
- a mark position system connected to the final projection system and arranged for detecting a position mark on a surface, such as the at least one chuck position mark on the chuck surface.

The lithography system according to the invention enables the determination of a spatial relationship of the beam properties, which may comprise: (i) the position of the patterning beam, (ii) the position of the beamlets, (iii) the spatial distribution of the beam properties of the patterning beam with respect to the chuck position mark, and/or (iv) the spatial distribution of the beamlets. It may provide the spatial relationship of the beam properties with respect to the chuck position mark.

The actuator system may move the chuck in a position where the chuck position mark is detected by the mark position system. The position of the chuck position mark may be determined in chuck position coordinates.

The actuator system may move the chuck in another position in which the patterning beam is incident on the beam measurement sensor. The position of the beam measurement sensor may be determined in chuck position coordinates. The beam measurement sensor may be arranged for measuring beam properties of the patterning beam at different locations on the measuring surface of the beam measurement sensor. In this way, the spatial distribution of the beam properties of the patterning beam may be determined or calculated in chuck coordinates.

Using the determined position of the chuck position mark in chuck position coordinates, now the spatial distribution of the beam properties of the patterning beam may be determined with respect to the position of the chuck position mark.

The process with the steps described above may be referred to as the initialization phase. The process with the steps described below may be referred to as the exposure phase.

The spatial distribution of the beam properties of the patterning beam with respect to a location of a position mark may be used to determine the spatial distribution of the beam properties of the patterning beam with respect to a target position mark on the target, and thus with respect to the target. It may provide a spatial relationship of the beam properties with respect to the target position mark.

In this way, the position of the patterning beam and/or the spatial distribution of its beam properties may be determined and used when projecting a pattern on the surface of the target.

The determination of said spatial distribution or spatial relationship may take place before each session of projecting a pattern on the target.

In this way, the lithography system may be arranged for determining the position of the target or wafer with respect to the patterning beam with a high reproducibility.

In an embodiment of the lithography system according to the invention, the mark position system is connected to the final projection system via a support, preferably a support ring supporting both the final projection system and the mark position system.

It may be understood that in the above the spatial distribution of beam properties with respect to the position of the at least one target position mark may only be determined using the spatial distribution of beam properties with respect to the position of the at least one chuck position mark, when a distance between a beam axis of the final projection system and a beam axis of mark position system is constant during the initialization phase and the exposure phase.

The term "beam axis of the final projection system" may refer to the beam axis of the beam that the final projection system may provide, while the term "beam axis of the mark position system" or the term "beam axis of the alignment sensor" may both refer to the axis of the (light) beam that the mark position system or alignment sensor transmit towards to surface in order to detect the position of a mark.

An advantage of connecting the mark position system to the final projection system via a support is that in that case the distance between them may be determined by the dimensions of the support only. Therefore, movements or deformations of other elements of the lithography system will not or to a lesser extend influence the distance between the beam axis of the final projection system and the beam axis of the alignment light beam provided by the mark position system.

In an embodiment of the lithography system according to the invention, the support comprises a low thermal expansion material, such as a glass-ceramic; and/or, wherein a distance between a beam axis of the mark position system and a beam axis of the final projection system preferably is relatively small compared to dimensions of the chuck, and/or is in the range of 10-100 mm or preferably in the range of 30-60 mm or more preferably about 45 mm.

The temperature inside a lithography system or the temperature of elements of a lithography system may vary over time. These temperature variations may cause these elements to deform. An advantage of providing a support comprising a low thermal expansion material (i.e. having a low thermal expansion coefficient) is that the temperature variations will not or to a lesser extend influence the dimensions of the support and thus of the distance between the final projection system and the mark position system.

The actual deformation (e.g. in micrometers) of elements of the lithography system is not only depend on the thermal expansion coefficient of the element but also on the dimensions of the element. When the distance between the mark position system and a beam axis of the final projection system is relatively small, an actual deformation may also be small.

In a further embodiment of the lithography system according to the invention, a distance between a centre of the beam measurement sensor and the chuck position mark corresponds to the distance between the beam axis of the mark position system and the beam axis of the final projection system. In another embodiment, the distance between the centre of the beam measurement sensor and the chuck position mark is substantially equal to the distance between the beam axis of the mark position system and the beam axis of the final projection system.

It may be the case that an error in a measurement by the chuck position sensor system of a distance between two points in chuck position coordinates is, among other, dependent of the distance, i.e. a larger measured distance may have a larger error. An advantage of these configurations is that the movement that is required to move the chuck from a position, in which the at least one chuck position mark is detected, to another position, in which beam properties are measured, is small or even absent. Thus the error may also be small. Please note that the position of the at least one chuck position mark may also be detected after beam properties are measured.

In an embodiment of the lithography system according to the invention, the lithography system further comprises a frame and at least three flexures, wherein the support is suspended from the frame with the at least three flexures. The frame may comprise a high thermal expansion material, such as aluminium.

An advantage of this configuration is that the frame and/or the final projection system may expand due to temperature changes, while the beam axis remains at the same position. In that case, the position of the patterning of the surface may be independent of thermal expansion of the frame carrier and/or final projection system.

In a further or preferred embodiment, the flexures are arranged substantially (or at least predominately) vertically, which may imply substantially parallel to the beam axis of the final projection system.

In an embodiment of the lithography system according to the invention, the beam measurement sensor is further arranged for providing beam properties information based on the measured beam properties of the patterning beam, the chuck position sensor is further arranged for providing chuck position information based on a measured position of the chuck, the mark position system is further arranged for providing mark detection information based on a detected mark, and the lithography system further comprises a processing unit arranged for:
  controlling the actuator;
  receiving the mark detection information, chuck position information and beam properties information;
  determining the position of the at least one chuck position mark in chuck coordinates;
  determining a spatial distribution of beam properties in chuck coordinates; and,
  determining a spatial distribution of beam properties with respect to the position of the at least one chuck position mark.

In an embodiment of the lithography system according to the invention, the target surface is provided with at least one target position mark thereon, and the mark position system is further arranged for detecting the at least one target position mark on the target surface. In a further embodiment of the lithography system according to the invention, the lithography system comprises said target.

In an embodiment of the lithography system according to the invention, the processing unit is further arranged for:
  determining the position of the at least one target position mark in chuck coordinates;
  determining a spatial distribution of beam properties with respect to the position of the at least one target position mark using the spatial distribution of beam properties with respect to the position of the at least one chuck position mark; and,
  controlling the projecting of the pattern on the surface using the spatial distribution of beam properties with respect to the position of the at least one target position mark.

In an embodiment of the lithography system according to the invention, the patterning beam comprises at least two separate patterning beamlets and wherein the beam properties may comprise a spatial distribution of the at least two patterning beamlets and/or a spatial distribution of a light intensity of the at least two patterning beamlets.

An advantage of the use of at least two patterning beamlets is that more of the surface of a target may be processed at the same time. The beam measurement sensor may be arranged to measure the position of the at least two beamlets with respect to each other, and/or with respect to a reference beam frame, wherein the reference beam frame indicates where the at least two beamlet are intended to be positioned, i.e. without projection errors.

In this way, projections error of the beamlets may be measured and may be compensated for, for example by the final projection system. Therefore, a lithography system according an embodiment of the invention may be suitably adapted for projecting thousand or millions of beamlets simultaneously on the target.

In an embodiment of the lithography system according to the invention, the at least one chuck position mark comprises four chuck position marks, and/or the at least one target position mark comprises four target position marks. An advantage of these configurations may be that it enables a more accurate determining of a position (in x- and y-direction, and maybe in z-direction) and/or of a orientation or a rotational position (Rx, Rz and/or Ry).

In an embodiment of the lithography system according to the invention, the mark position system comprises at least one alignment sensor, the alignment sensor being arranged for providing an alignment light beam, for measuring a light intensity of a reflected alignment light beam, wherein the reflected alignment light beam is generated by reflection on the surface and, preferably, for providing mark detection information based on a measured light intensity.

An advantage of this embodiment may be that this alignment sensor may be constructed in a relatively simple way with relatively small dimensions (with respect to the dimension of the final projection system).

In an embodiment of the lithography system according to the invention, the chuck position mark and/or the target position mark comprises at least a first and a second reflective area, wherein the first reflective area has a higher reflection coefficient than the second reflective area. An advantage of this embodiment may be that this kind of position mark may be constructed in a relatively simple way.

In an embodiment of the lithography system according to the invention, the alignment sensor is arranged for providing the alignment light beam with a wavelength and at least one of the first and second reflective area comprises structures with dimensions smaller than said wavelength.

An advantage of this embodiment may be that the reflection coefficient of the mark may be at least partially described by a sinusoidal function. This would imply that the light intensity of the reflected light beam may also be described by a sinusoidal function. The measurement of such a light intensity may be easily and accurately matched with the position of the mark. In this way, the position of the mark may be more accurately or more easily determined.

In an embodiment of the lithography system according to the invention, the chuck position mark and/or the target position mark comprises an NVSM-X mark. The NVSM-X mark is widely used on wafers to mark a position.

The object of the present invention is also met by the provision of a method for operating a lithography system for processing a target, such as a wafer, said method comprising:
during an initialization phase:
a1) providing a chuck, the chuck comprising a beam measurement sensor and a chuck surface, the chuck surface provided with at least one chuck position mark thereon, wherein the chuck is moveable in chuck coordinates;
a2) determining a position of the at least one chuck position mark in chuck coordinates;
a3) providing a patterning beam, preferably comprising at least two beamlets;
a4) measuring beam properties of the patterning beam, the beam properties comprising a spatial distribution of an intensity of the patterning beam; and/or preferably a spatial distribution of the at least two beamlets;
a5) determining a spatial distribution of the beam properties in chuck coordinates;
a6) determining a spatial distribution of the beam properties with respect to the position of the at least one chuck position mark.

It may be understood that step a2) may also be performed after step a4), instead of before step a3).

In a further embodiment of the method according to the invention, the method further comprises:
during an exposure phase:
b1) providing a target with a target surface, the target surface provided with at least one target position mark thereon;
b2) determining the position of the at least one target position mark in chuck coordinates;
b3) determining a spatial distribution of beam properties with respect to the position of the at least one target position mark using the spatial distribution of beam properties with respect to the position of the at least one chuck position mark; and,
b4) patterning the target surface using the spatial distribution of beam properties with respect to the position of the at least one target position mark.

In a further embodiment of the method according to the invention, the method further comprises the step of:
maintaining a distance between a beam axis of the final projection system and a beam axis of mark position system constant during the initialization phase and the exposure phase.

The advantages of these embodiments of the method according to the invention may be similar to the advantages of the embodiments of the lithography system as described above.

In an embodiment of the alignment sensor, the alignment sensor comprises:
a light source arranged for providing an alignment light beam;
a light intensity detector arranged for determining a light intensity of a reflected alignment light beam, wherein the reflected alignment light beam is generated by reflection of the alignment light beam on said surface; and,
an optical system arranged for focusing the alignment light beam on the surface and for guiding the reflected alignment light beam to the light intensity detector.

In an embodiment of a position mark (for example a chuck position mark or a target position mark), the position mark may comprise at least one trench or at least a first and a second reflective area, wherein the first reflective area has a higher reflection coefficient that the second reflective area.

When the alignment light beam is reflected on an edge of the trench in the surface, a phase difference will occur between light reflected on the lower part of the trench and light reflected on the higher part of the trench. As a result of (destructive) interference of the light reflected on the lower part of the trench and the light reflected on the higher part of the trench, the intensity of the reflected alignment light beam will be affected. The maximum effect may occur when half of the alignment light beam is reflected on the lower part of the trench and half of the alignment light beam is reflected on the higher part of the trench.

When the light beam is completely reflected on the bottom of the trench or completely reflected on the higher part of the trench, this type of interference may not take place.

In the case of the mark comprising at least a first and a second reflective area, wherein the first reflective area has a higher reflection coefficient that the second reflective area, the light intensity of the reflected alignment light beam will depend on the local coefficient of reflection.

In an embodiment, the alignment sensor is arranged for providing the alignment light beam with a wavelength and at least one of the first and second reflective area comprises structures with dimensions smaller than said wavelength. Sub-wavelength structures, i.e. structures with dimensions smaller than a certain wavelength are known to absorb a part of the light that is reflected on it.

Therefore, the detected light intensity of the reflected alignment light beam will depend on the presence of the mark. In this way the position of the mark can be determined.

Since the variation of the light intensity of the reflected alignment light beam may be detected at the central axis of the reflected alignment light beam, a single light intensity detector may be used, which may be positioned in the central axis of the reflected alignment light beam in a straightforward manner. Therefore, measuring second or higher order diffraction light beams may not be required.

In an embodiment of the alignment sensor, the light source comprises a laser arranged for generating the alignment light beam and an optical fiber for guiding the alignment light beam from the laser to the optical system.

An advantage of the use of an optical fiber for guiding the light beam from the laser to the optical system may be that it enables that the laser is positioned outside a vacuum chamber of the lithography system, such that the heat that the laser may produce will not affect the temperature inside the vacuum chamber.

In an embodiment of the alignment sensor, the optical system comprises a beam splitter arranged for guiding at least a part of the alignment light beam towards the surface and for guiding at least a part of the reflected alignment light beam towards the light intensity detector.

An advantage of a beam splitter is that the same optical path may be used for the alignment light beam towards the surface and for the reflected alignment light beam from the surface towards the light intensity detector. Therefore, alignment sensor may be constructed in a relatively small volume.

In an embodiment of the alignment sensor, the light source comprises a collimator lens for collimating the alignment light beam from the light source. In an embodiment of the alignment sensor, the optical system further comprises a focus lens arranged for focusing the alignment light beam on the surface and for collimating the reflected alignment light beam.

In an embodiment of the alignment sensor, the optical system further comprises another focus lens arranged for focusing the reflected alignment light beam on the light intensity detector. In an embodiment of alignment sensor, the optical system further comprises a diaphragm positioned between the beam splitter and the light intensity detector.

An advantage of this embodiment is that the diaphragm may cause the signal/noise ratio of the light intensity detection to be increased.

In an embodiment of the alignment sensor, the light source is arranged for providing a polarized alignment light beam, preferably a S-polarized alignment light beam, the beam splitter is a polarizing beam splitter, arranged for guiding the polarized alignment light beam towards the surface, preferably for guiding the S-polarized alignment light beam towards the surface, the optical system further comprises a quarter wave plate, which is located in a light path of both the alignment light beam and the reflected alignment light beam between the polarizing beam splitter and the surface, preferably arranged for converting the S-polarized alignment light beam into a right circular polarized alignment light beam and for converting a left circular polarized reflected alignment light beam into a P-polarized reflected alignment light beam, wherein the left circular polarized reflected alignment light beam is generated by reflection of the left circular polarized alignment light beam on the surface and the beam splitter is further arranged for guiding a polarized reflected alignment light beam towards the light intensity detector, preferably for guiding the P-polarized reflected alignment light beam towards the light intensity detector.

An advantage of this configuration is that in a polarizing beam splitter, the guiding of the light may be dependent on the polarization of the light. In this case, substantially all light from the alignment light beam may be guided towards the surface, while substantially all light from the reflected alignment light beam may be guided towards the light intensity detector. In a non-polarizing beam splitter, a much larger part of the alignment light beam may not be guided towards the surface and may thus be lost. Also, a much larger part of the reflected alignment light beam may not be guided towards the light intensity detector and may thus be lost.

In an embodiment of the alignment sensor, the light source is arranged for providing an alignment light beam with a wavelength and the at least one trench has a depth, wherein the depth is substantially equal to a quarter of said wavelength. An advantage of this configuration may be that the (destructive) interference may be at its maximum when the trench has a depth of a quarter wavelength, and the difference in optical path length is a half wavelength.

In an embodiment of the alignment sensor, the alignment sensor further comprises a height measurement system arranged for measuring the distance between the alignment sensor and the surface.

The spot size of the alignment light beam at surface should be small for an optimal contrast. The alignment sensor may be positioned such that the surface with the mark is located in the waist of the alignment light beam. However, the depth of focus of the alignment light beam that has been focused by the focus lens may be relatively small. Therefore, it may be necessary that the distance between surface and the alignment sensor is controlled. The height measurement system may provide the information for this control process.

In an embodiment of the alignment sensor, the height measurement system is further arranged for measuring the tilt of the alignment sensor system with respect to the surface. Tilt of the alignment sensor with respect to the surface may influence among others the direction of the reflected alignment light beam from the surface towards the alignment sensor. Since the optical system may be aligned for a reflected alignment light beam with a certain direction, a tilt may cause a loss of light intensity of the reflected alignment light beam. Therefore, it may be necessary that the tilt of the alignment sensor with respect to the surface is controlled. The height measurement system may provide the information for this control process.

In an embodiment of the alignment sensor, the optical system further comprises a transparent plate positioned between the focus lens and the surface. An advantage of this embodiment may be that some embodiments of the focus lens are arranged to focus a light beam in a combination with a transparent plate. Another advantage of the transparent plate may be that the height measurement system may be constructed on the transparent plate. In an embodiment of the alignment sensor, the height measurement system is arranged on the transparent plate, wherein the height measurement system is facing the surface.

In an embodiment of the alignment sensor, an incident angle defined by the alignment light beam and the surface is substantially equal to 90 degrees. The advantage of this embodiment is that it enables the use of some same optical elements for the alignment light beam and the reflected alignment light beam.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
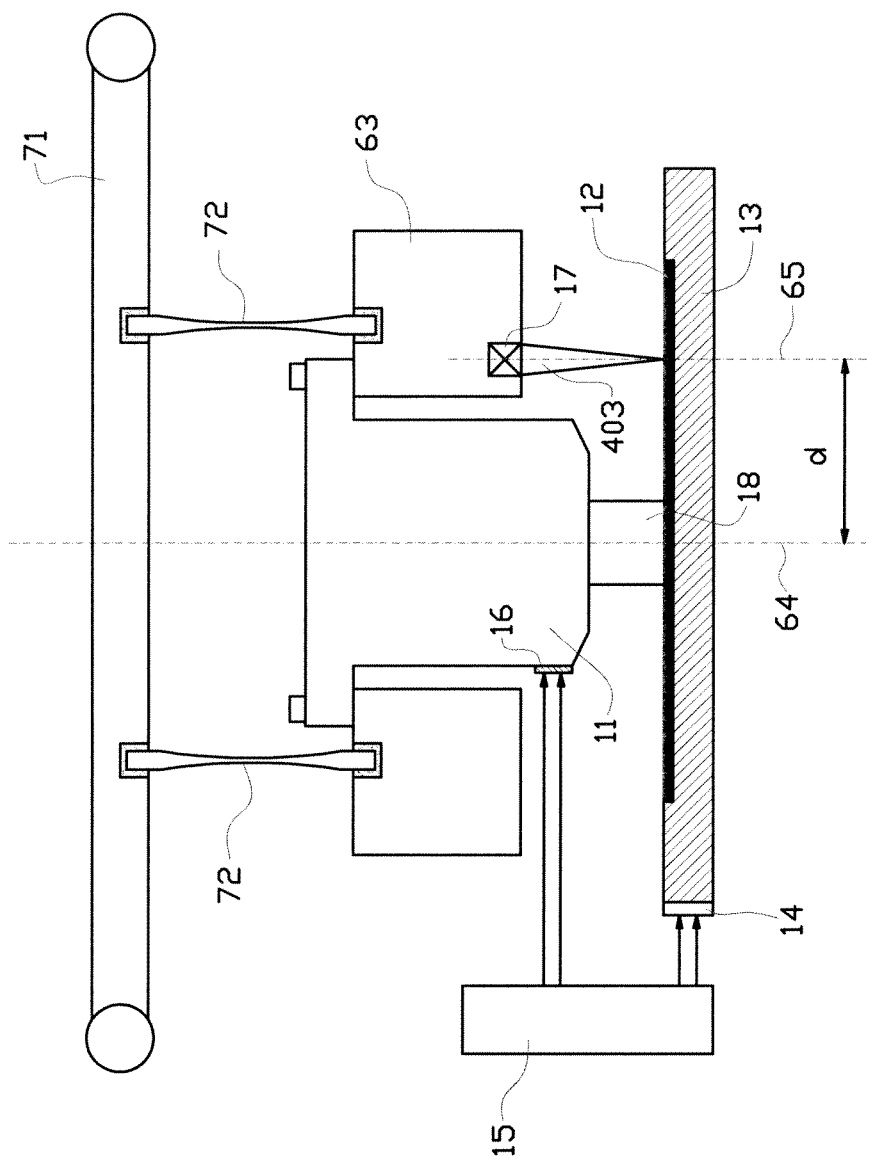
FIG. 1 shows a schematic overview of parts of embodiments of a lithography system according to the invention.

FIG. 1 shows a schematic overview of parts of embodiments of a lithography system according to the invention.

A final projection system 11 may be arranged for receiving a patterning beam from a beam source. The beam source is not shown in FIG. 1, but an example may be seen in FIG. 8. The final projection system 11 may comprise collimators, lenses or other (electro)-optical elements to shape and/or direct the patterning beam. The final projection system may be a (final) part of a projection column, the projection column comprising the beam source, deflector and other (electro)-optical elements. The projection column may be an optical projection column or a charge particle optical projection column.

The patterning beam 18 is directed towards a surface 12. This surface 12 may be surface of a target, such as a wafer or the measuring surface of a beam measurement sensor. The beam measurement sensor and/or the target/wafer may be provided on a chuck 13.

The chuck 13 may be moveable in at least one dimension (x) or direction. In an embodiment, the chuck 13 is moveable in two (x, y) or three (x, y, z) dimensions. It is also possible that chuck 13 is moveable in at least one rotational (Rz), two rotational (Rz, Ry) or three rotational directions (Rx). The chuck may be provided with at least one chuck position mirror 14.

The lithography system may be provided with a actuator system. The actuator system is not shown in FIG. 1, but an example be seen in FIG. 8. The actuator system may be arranged for moving the chuck in one of the above-mentioned directions. Such actuators systems may be known in the art.

In FIG. 1 an embodiment of a chuck position sensor system is shown, comprising a differential interferometer 15. The differential interferometer may use two mirrors, a chuck position mirror 14 and a final projection system position mirror 16. In this way the interferometer is arranged to detect or measure movements of the chuck 13 with respect to the final projection system 11.

The chuck position sensor system may comprise more than one differential interferometers 15 in order to detect the position of the chuck in more than one direction.

It may be understood that also other types of chuck position sensor systems may be used for determining a position of the chuck 13 with respect to the final projection system 11.

The lithography system may be provided with a mark position system 17. The mark position system 17 is arranged for detecting a position mark on a surface. Such a position mark may provided on a surface of chuck 13, i.e. a chuck position mark or it may be provided on a surface of a target, i.e. a target position mark.

Figure 2:
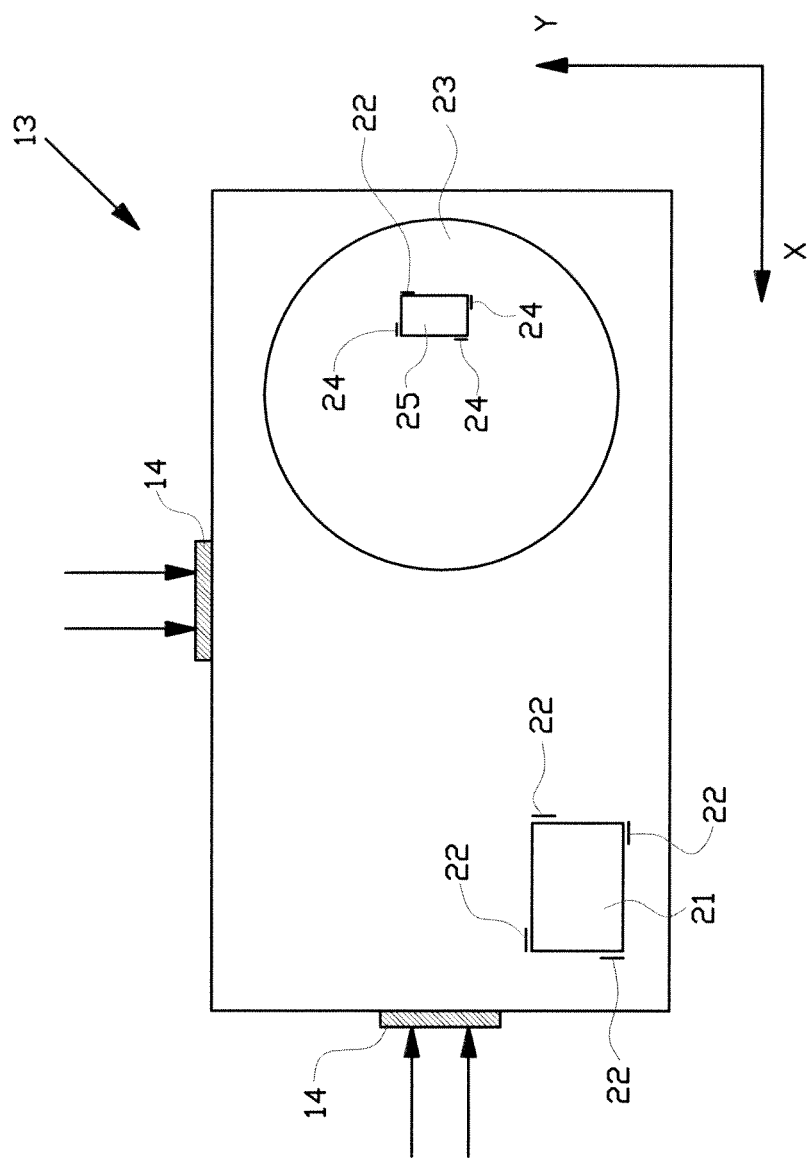
FIG. 2 shows a schematic top view of an embodiment of a chuck.

FIG. 2 shows a schematic top view of an embodiment of a chuck 13. The chuck 13 is provided with a beam measurement sensor 21 and chuck position marks 22. In FIG. 2 the chuck 13 is provided with four chuck position marks but any other number of chuck position marks 22 may also be provided. The beam measurement sensor in FIG. 2 has a rectangular shape but it may also have a circular or another shape. The four chuck position marks may be positioned at the ends of the sides of the rectangular shape, wherein none of the chuck position marks is adjacent to another.

The chuck 13 may be supporting target 23, for example a wafer. The surface of the target may be provided with four target position marks 24. The target position marks 24 are arranged around an exposure field 24. A target may comprise many exposure fields. An exposure field may have a rectangular shape. Also the four target position marks may be positioned at the ends of the sides of the rectangular shape, wherein none of the target position marks is adjacent to another. The chuck 13 may be provided with two chuck position mirrors 14. The chuck 13 may be movable in a x- and a y-direction, thus also the beam measurement sensor and the target.

Figure 3:
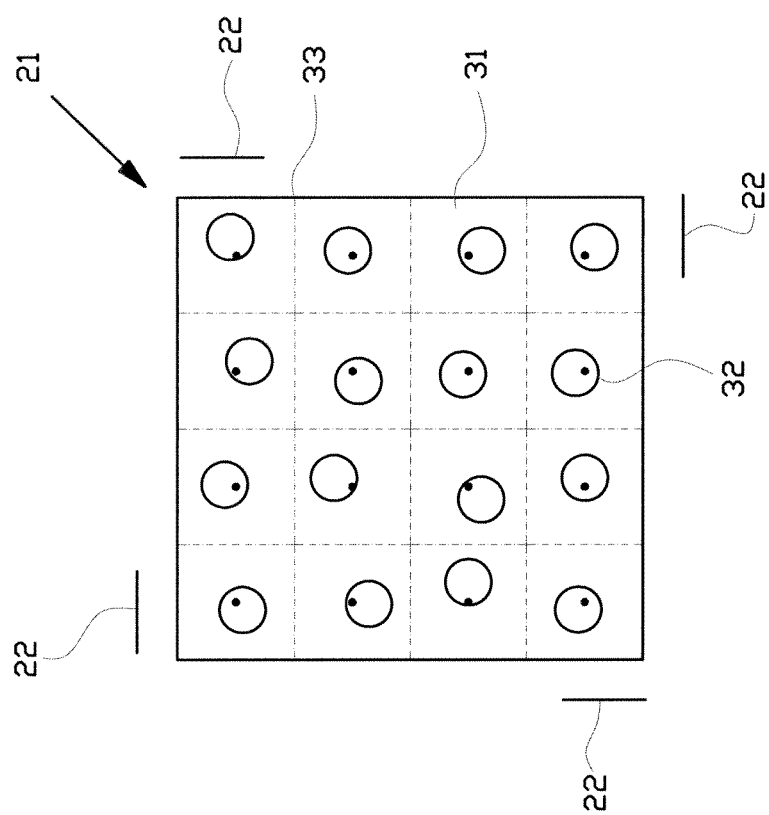
FIG. 3 shows a schematic top view of an embodiment of a beam measurement sensor.

FIG. 3 shows a schematic top view of the beam measurement sensor. The beam measurement sensor may comprise a (measuring) surface 31 which may be arranged for detecting an intensity of an incident beam as a function of the position it is incident on the surface 31.

The beam may comprise several beams, referred to as beamlets. These beamlets may be generated by splitting a beam, for example, by the final projection system. Also, the final projection system may be arranged for shaping each beamlet individually. In the example of FIG. 3, the beam comprises twelve beamlets. Their incident spots have been indicated by twelve open circles 32.

The beam measurement sensor may be thought of having a reference beam frame 33. In the reference beam frame 33 the intended position of the twelve beamlets is indicated by a dot. In other words, if the final projection system would be able to perfectly project the beam, comprising the beamlets, on a surface, the beamlets would be incident on the intended positions. However, projections error will probably occur and in FIG. 3 it is shown, as an example, how many beamlets hit the surface at different positions then their intented positions. The difference between the intended position and the measured position may be referred to as the projection error of said beam or said beamlet.

The beam measurement sensor may be arranged for measuring the projection error of the beam or the beamlets. The beam measurement sensor may be arranged for measuring the distance between two or more incident spots of the beamlets. In both ways, a spatial distribution of the beam intensity, i.e. one of the possible beam properties of a beam, may be determined.

Below operation of the lithography system according to an embodiment of the invention, for example the embodiment of FIGS. 1, 2 and/or 3, is described. The operation may be described referring to an initialization phase and an exposure phase.

In a first step of the initialization phase, the actuator may move the chuck in order to determine the position of the chuck position marks. The chuck position marks may be detected when they are at a location where the mark position system is able to detect them. The mark position system may comprise more than one alignment sensor. In that case, more than one chuck position mark may be detected at the same time. When the number of chuck position marks is larger than the number of alignment sensors, it may be necessary to move the chuck in order to detect all chuck position marks.

The position of each chuck position mark may be determined in chuck position coordinates. That may imply that whenever a chuck position mark is detected, the position of the chuck detected by the chuck position sensor system in chuck coordinates is referred to as the position of the chuck position mark in chuck coordinates. The chuck position marks may also provide information about the position and/or orientation of the beam measurement sensor in chuck position coordinates.

In a next step, the chuck is positioned in a position where the beam measurement sensor may receive the patterning beam from the final projection system. This position may also be expressed in chuck position coordinates. The beam measurement sensor may then be used to determine a spatial distribution of beam properties, for example the intensity of the beamlets as a function of the incident spot location on the surface of the beam measurement sensor.

Because the position and the orientation of the beam measurement sensor can be related to the position of the chuck position marks, the spatial distribution may be determined with respect to the chuck position marks. For example, the chuck position marks may be used to define a coordinate system. The position of each beamlet, or the position of a maximum of the beam intensity of each beamlet, may then be expressed in de coordinates of this coordinate system. A set of locations of the beamlets in this coordinate system may be referred to as a spatial distribution of beam properties with respect to the chuck position marks.

After the above-described initialization phase, an exposure phase may take place. In a first step of the exposure phase, the actuator may move the chuck in order to determine the position of the target position marks. The target position marks may be detected when they are at a location where the mark position system is able to detect them. When the number of target position marks is larger than the number of alignment sensors, it may be necessary to move the chuck in order to detect all target position marks.

The position of each target position mark may be determined in chuck position coordinates. Whenever a target position mark is detected, the position of the chuck detected by the chuck position sensor system in chuck coordinates is referred to as the position of the target position mark in chuck coordinates. The target position marks may also provide information about the position and/or orientation of the target and/or one or more exposure fields in chuck position coordinates.

When more than one target position mark is provided, the target position marks may be used to determine the position and/or orientation of the said coordinate system on the target surface. The spatial distribution of beam properties with respect the target position marks or with respect to said coordinate system may thus be determined using the position of the target position marks and the spatial distribution of beam properties with respect to the chuck position marks. Also in this case, a set of locations of the beamlets in said coordinate system may be referred to as a spatial distribution of beam properties with respect to the chuck position marks.

In a next step, the spatial distribution of beam properties with respect the target position marks or with respect to the coordinate system may be used to project a pattern on the target surface.

Figure 8:
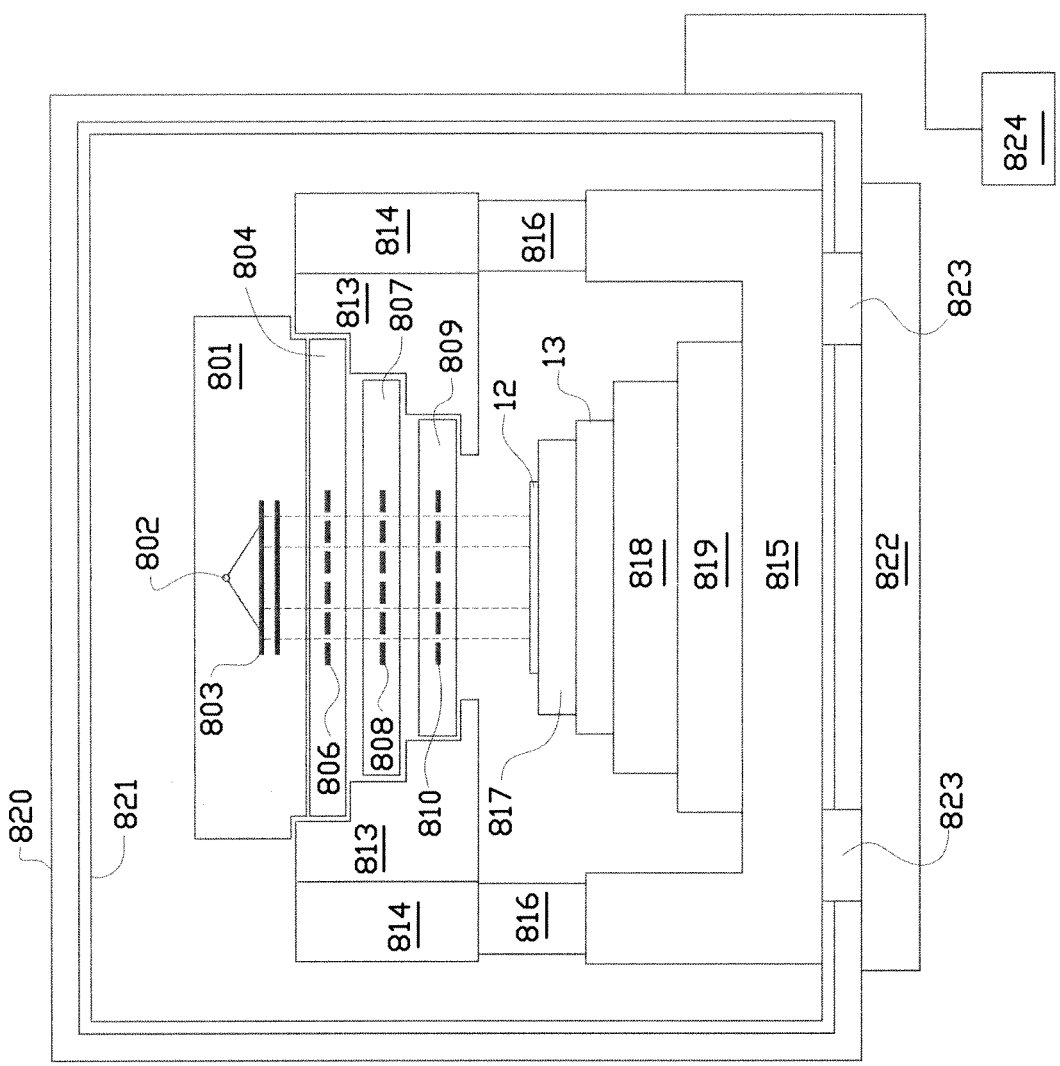
FIG. 8 shows a schematic overview of a lithography system according to an embodiment of the invention.

In an embodiment of the lithography system, the system may comprise a processing unit. An example of a processor unit is shown in FIG. 8. The processing unit may be arranged for performing and/or controlling the above-mentioned steps or activities. For example, the processing unit may be arranged for one or more of the following steps:
controlling the actuator;
receiving the mark detection information, chuck position information and beam properties information;
determining the position of the at least one chuck position mark in chuck coordinates;
determining a spatial distribution of beam properties in chuck coordinates; and,
determining a spatial distribution of beam properties with respect to the position of the at least one chuck position mark.
determining the position of the at least one target position mark in chuck coordinates;
determining a spatial distribution of beam properties with respect to the position of the at least one target position mark using the spatial distribution of beam properties with respect to the position of the at least one chuck position mark; and,
controlling the projecting of the pattern on the surface using the spatial distribution of beam properties with respect to the position of the at least one target position mark.

The processing unit may be arranged for receiving one or more of the following: (i) beam properties information, provided by the beam measurement sensor based on the measured beam properties of the patterning beam, (ii) chuck position information, provided by the chuck position sensor based on a measured position of the chuck, (iii) mark detection information, provided by the mark position system based on a detected mark.

In FIG. 1 (and in FIG. 6) a distance between a beam axis 64 of the final projecting system and an alignment light beam axis 65 of the mark position system is indicated by d. When this distance d is during the exposure phase different from the distance d during the initialization phase, position errors may occur during the patterning of the target surface.

In an embodiment, the mark position system 17 may be connected to the final projection system 11 via a support or support ring 63 as in shown in FIGS. 1 (and 6). The support ring may comprise a low thermal expansion material, such as glass-ceramics, Pyrex and/or Zerodur. Furthermore, the distance between the beam axis 64 of the final projection system and the beam axis 65 of the alignment sensor may be relatively small compared to dimensions of the chuck, and/or to the dimensions of the final projection system, and/or is in the range of 10-100 mm or preferably in the range of 30-60 mm or more preferably about 45 mm. In this way, the deformation of the support ring (e.g. in micrometers) due to temperature changes may be limited.

Figure 4:
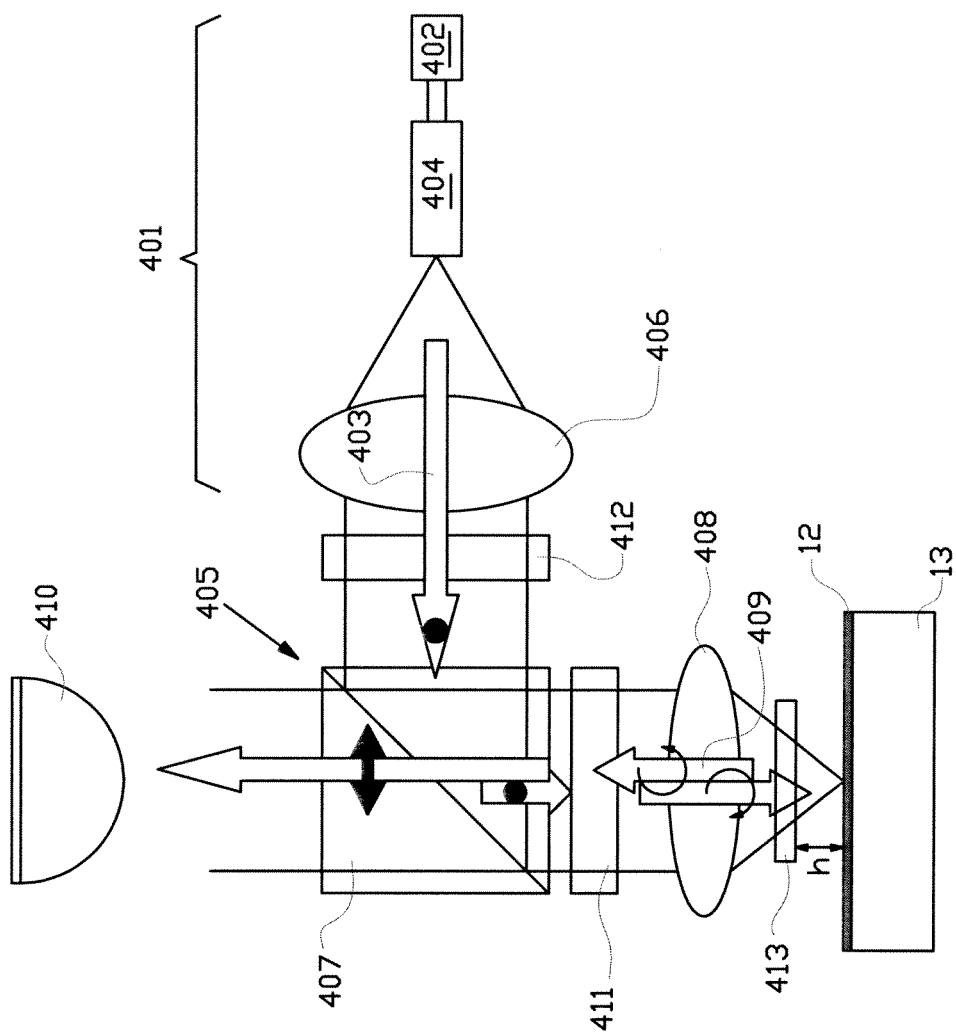
FIG. 4 shows schematically an overview of an alignment sensor according to an embodiment of the invention.

FIG. 4 shows schematically an overview of an alignment sensor according to an embodiment of the invention.

The light source 401 may comprise a laser 402 for providing an alignment light beam 402. The laser 402 may be arranged for providing an alignment light beam 403 with a wavelength in the range of 600-650 nm, or about 635 nm. The light source 401 may further comprise an optical fiber 404 for guiding the light beam 403 from the laser 402 towards the optical system 405. The alignment light beam leaving the optical fiber 404 may have nearly perfect Gaussian profile and may be easily collimated. The light source may comprise a collimator lens 406 arranged for collimating the light beam 403 from optical fiber 404. However, when a fiber is not used and the laser or another light generating device provides a collimated light beam, such a collimating lens 406 may not be required.

In another embodiment, the light source 401 is arranged to provide a Bessel light beam. A Bessel light beam may be characterized in that in a spot of a Bessel light beam, the energy profile (e.g. intensity as function of the distance from the centre) may be described with a Bessel function instead of a Gaussian function. An advantage of a Bessel light beam is that the spot may be small, while the depth of focus is large.

The optical system 405 may further comprise a beam splitter 407, for directing the light beam 403 towards surface 12. The optical system 405 may comprise a focus lens 408 for focusing alignment light beam 403 on the surface 12. The reflected alignment light beam 409 is generated by reflection on the surface 12 of the alignment light beam 403. The focus lens 408 may also be used for collimating the reflected beam 409. The beam splitter may then direct reflected beam 409 towards the light intensity detector 410.

The light intensity detector 410 may comprise a photodiode or an un-biased silicon PIN diode working in the photovoltaic mode. This mode may lower the amount of heat generated with respect to a biased mode operation of a photodiode. The light intensity detector may also comprise an operational amplifier to convert the current from the photodiode into a voltage which may be filtered. The filtered voltage may converted to a digital signal, that may be used by a processing unit, for example the processing unit of the lithography system the alignment sensor is a part of.

The active area of the light intensity detector 410 may be larger than the diameter of the reflected alignment light beam 409 leaving the beam splitter 407. An other focus lens (not shown in FIG. 4) may positioned between the beam splitter 407 and light intensity detector 410 to focus the reflected alignment light beam on the active area, in order to use all the energy leaving the beam splitter 407.

In a non-polarizing beam splitter it may be the case that 50% of the alignment light beam 11 is directed towards the surface 12, while the other 50% may be lost. And of the reflected alignment light beam only 50% may be directed to the light intensity detector, while the other 50% may be lost. This implies that 75% of the alignment light beam 103 is lost, i.e. is not used for the position detection.

Therefore, a polarizing beam splitter 407 may be used in an embodiment of the alignment sensor. In that case, the light source may provide a polarized alignment light beam 403. The light source may comprise a polarizer 412 arranged for transforming a non-polarized light beam into a polarized light beam. Alignment light beam 403 may be a S-polarized light beam, which is indicated in FIG. 4 by a dot.

The polarizing beam splitter 407 may be arranged for guiding the S-polarized alignment light beam towards the surface. The optical system may further comprise a quarter wave plate 411, which may be located between the polarizing beam splitter 407 and the focus lens 408. When the alignment light beam 403 travels through the quarter wave plate 411, it may change its polarization from S-polarization into a right circular polarization, as is indicated by a curved arrow in FIG. 4. When the alignment light beam 403 is reflected by the surface 12, polarization may change again: the reflected alignment light beam 409 may have a left circular polarization, as is indicated by another curved arrow in FIG. 4. When the reflected alignment light beam 408 travels through the quarter wave plate 411, it may change its polarization from left circular polarization into a P-polarization which is indicated by a straight arrow in FIG. 4. Polarizing beam splitter 407 may be arranged to guide the P-polarized reflected alignment light beam towards the light intensity detector 410.

The use of a polarized alignment light beam, a polarized reflected alignment light beam and a polarizing beam splitter may result in a reduction of stray light, back reflection and energy loss in the beam splitter. Furthermore, the polarizing filter 412 may be arranged to minimize reflection of light back into the light source.

In an embodiment of the alignment sensor, the focus lens 408 is arranged to focus alignment light beam 403 on surface 12 in cooperation with an transparent plate 413, which may refract both the alignment light beam 403 and the reflected alignment light beam 409. The refraction depends on the material of the transparent plate 41.

A height measurement system may be provided to measure the distance h between the alignment sensor and the surface 12 and/or the tilt of the height measurement system or the alignment sensor with respect to the surface.

With information about the distance h between the alignment sensor and the surface and/or the tilt of the alignment sensor with respect to the surface, said distance h and/or the tilt may be adapted to obtain or maintain the desired distance and/or tilt.

In an embodiment, the actuator may be arranged for changing said distance h and/or said tilt. In an further embodiment, the processing unit may be arranged for receiving information about said distance and/or tilt from the height measurement system.

The height measurement system may be an optical height measurement system or a capacitive height measurement system. The capacitive height measurement system may be a differential capacitive height measurement system.

Figure 5:
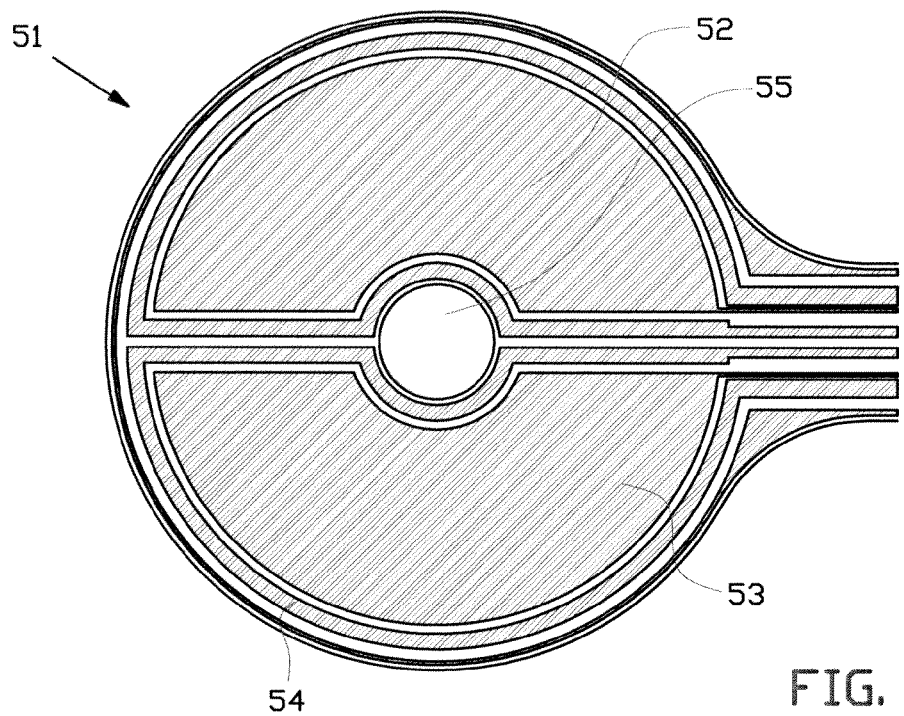
FIG. 5 schematically shows a view of an embodiment of a part of a differential capacitive height measurement system 51 according to an embodiment of the invention.

FIG. 5 shows schematically a view of an embodiment of a part of a differential capacitive height measurement system 51 according to an embodiment of the invention. The differential capacitive height measurement system may comprise a first measuring electrode 52, a second measuring electrode 53 and a guard 54, which are all electrically insulated with respect to each other.

The first measuring electrode 52, the second measuring electrode 53 and the guard 54 may comprise a thin layer comprising a metal such as copper. The first and the second measuring electrode may both have a half-moon like shape and may enclose together a circular opening 55.

The first measuring electrode 52, the second measuring electrode 53 and the guard 54 may be connected to a height measuring processing unit (not shown in FIG. 5) that may be arranged for determining the above-mentioned distance and/or tilt. The differential capacitive height measurement system may comprise such a processing unit. For the determining the above mentioned tilt, two pairs of measuring electrodes may be required, e.g. two structures as shown in FIG. 5.

The circular opening 55 may be arranged such that the alignment light beam and the reflected alignment light beam may pass through the circular opening 55 during the operation of the alignment sensor. Because of this arrangement of the differential capacitive height measurement system, the distance between the height measurement system and the surface may be measured at the location of the centre of the circular opening 55, thus at the location where the light beam and the reflected light beam may travel towards or from the surface, or at the location of the beam axis. Also the abovementioned tilt may be measured at the location of the centre of the circular opening 55, using two pairs of measuring electrodes. These may be arranged one on top of the other and both may be arranged around the circular opening 55. An orientation of the first pair of measuring electrodes may be shifted with respect to an orientation of the second pair of measuring electrodes, for example by 90 degrees.

The differential capacitive height measurement system 51 of FIG. 5 may be arranged on the transparent plate 413 as is shown in FIG. 4, wherein the differential capacitive height measurement system is facing the surface. In this way, the distance between the differential capacitive height measurement system 51 and the focal plane of focus 12 (where the surface should be positioned) may be minimal, which may be an advantage since the performance of the differential capacitive height measurement system may decrease with the distance between the differential capacitive height measurement system and the object it is facing, in this case the surface 12.

In case the light source is arranged for providing a Bessel light beam, a height measurement system may not be required, since the relatively large depth of focus of such a beam allows for more inaccuracy in the distance between the alignment sensor and the surface.

In an embodiment, the mark position system comprises two alignment sensors, wherein each alignment sensor may be in accordance with embodiments of an alignment sensor described in this document. With two alignment sensors the position of a surface comprising two position marks may be easily determined in two dimensions, in an x-direction and a y-direction, or in a deflection direction and a scan direction.

The scan direction or axis may relate in electron beam lithography to the direction in which the target, such as a wafer, is being scanned during the patterning, while the deflection direction or axis may relate to the direction in which electron beam are being deflected during the patterning.

Figure 6:
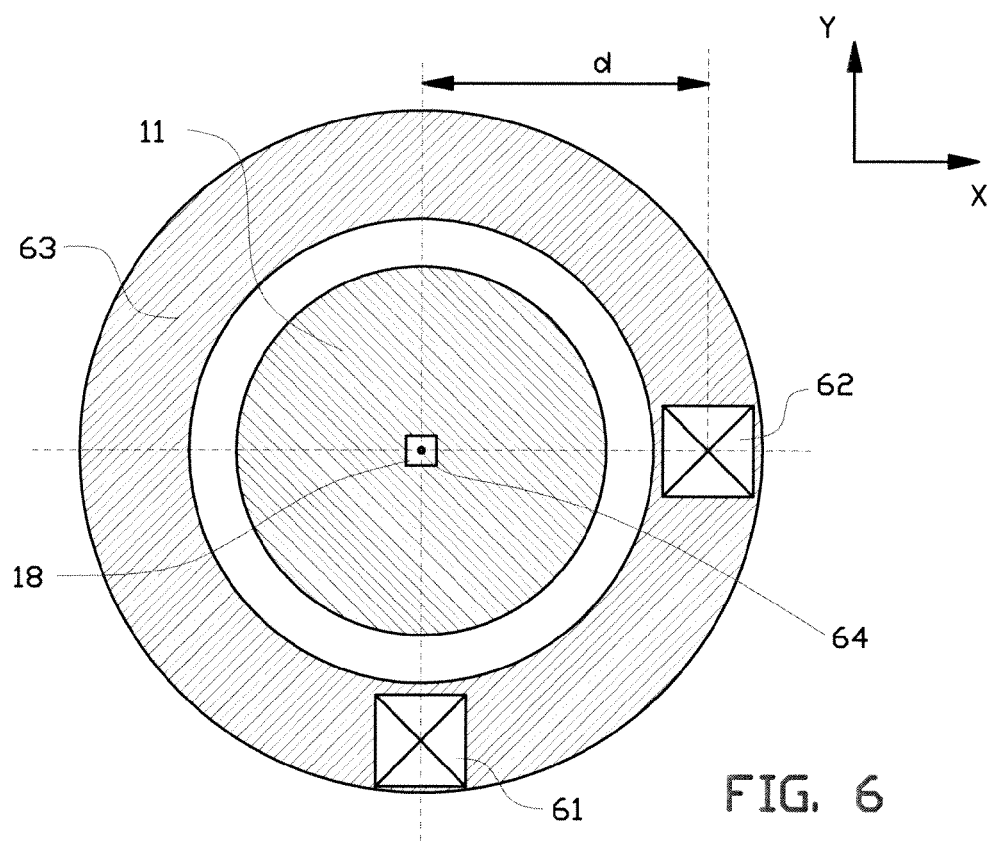
FIG. 6 schematically depicts a part of a cross-section of an embodiment of a lithography system, according to the invention.

FIG. 6 depicts a part of a cross-section of an embodiment of a lithography system, according to the invention. A first alignment sensor 61 may be arranged to detect the position of the surface in the y-direction and a second alignment sensor 62 may be arranged to detect the position of the surface in the x-direction. Beam 18 is depicted in the centre of FIG. 6. In the centre of the beam 18 the beam axis is indicated by a dot 64, while the beam axes of alignment sensors 61, 62 may be found at their respective centres. The above-mentioned distance d between the beam axis of the final projection system 11 and the beam axis of the alignment sensor 62 is indicated in FIG. 6. Also indicated in FIG. 6 is the support 63, which may have a ring-shape.

In FIG. 1, it is depicted how the support 63 may be connected to a frame 71 via three flexures 72 (only two flexures are shown in FIG. 1). The support 63 may be suspended from the frame 71. At least three flexures may be required to define the position of the ring in space. The flexures 72 may comprise a resilient material. The flexures 72 may be glued in recesses in the support 63, as may be seen in FIG. 1.

It may be understood from FIGS. 1 and 6, that if the final projection system would expand in a radial direction (i.e. perpendicular to the beam axis of the final projection system) due for example to temperature variations, the beam axis will remain at its position with respect to the surface 12. This expansion of the final projection system in radial direction may cause the support 63 to expand also in the radial direction. Because of the flexures, this would not cause an expansion force in the radial direction on frame 71. Likewise, any expansions of frame 71 in a radial direction would not cause an expansion force on the support 63 because of the flexures 72. Therefore, the frame 71 may comprise a high thermal expansion material, such as aluminium.

Figure 7:
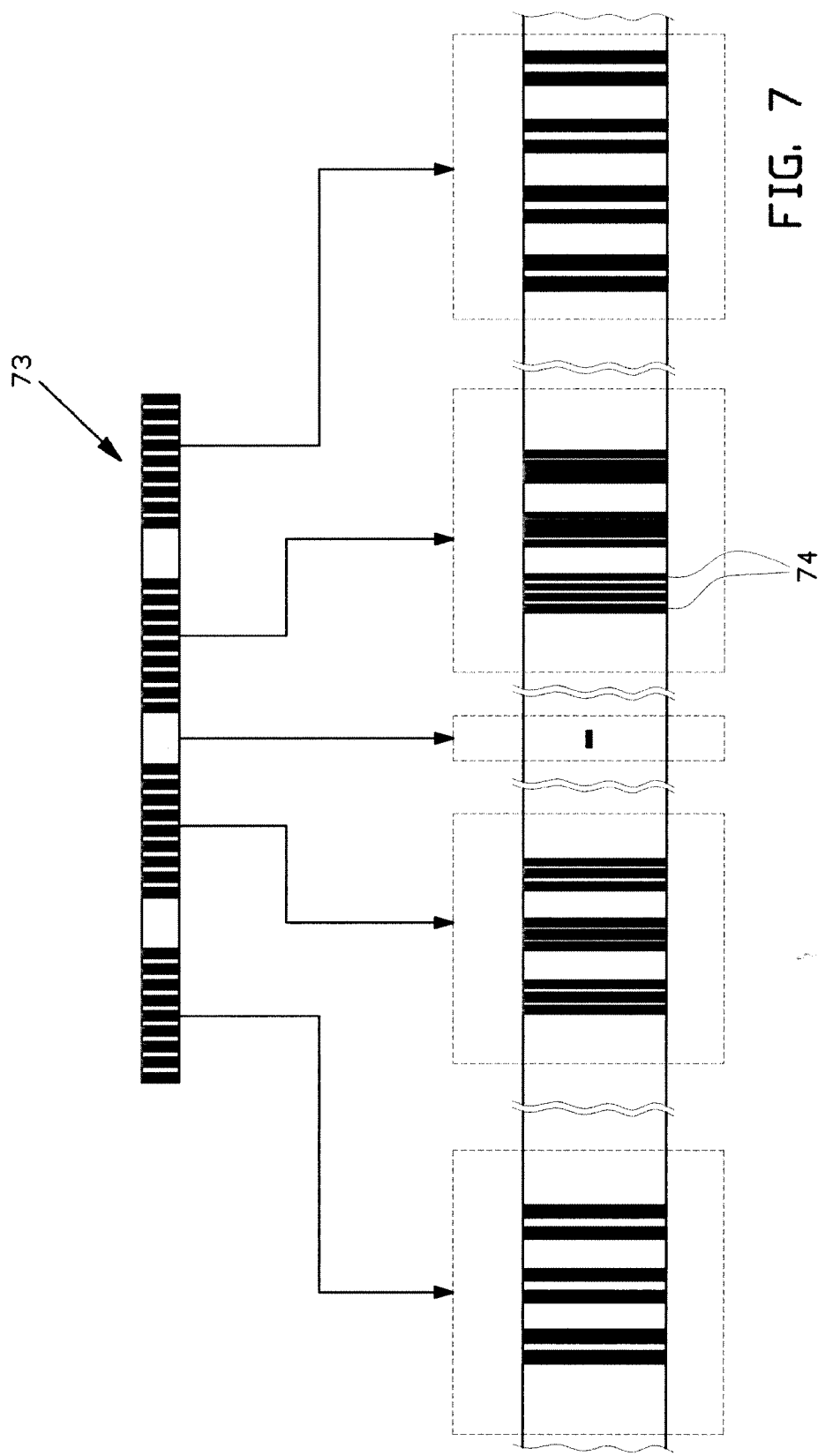
FIG. 7 shows a schematic overview of a position mark, such as a target position mark or a chuck position mark, according to an embodiment of the invention.

FIG. 7 shows a schematic overview of a position mark 73, such as a target position mark or a chuck position mark, according to an embodiment of the invention. The position mark 73 may comprises several areas 74, wherein a first reflective area has a higher reflection coefficient that a second reflective area, or vice versa.

FIG. 8 shows a schematic overview of a lithography system according to an embodiment of the invention. FIG. 8 provides an overview of a lithography system, which may comprise embodiments of elements of a lithography system as is described in this document.

The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 8, these modular subsystems include an illumination optics module 801 which may comprise a beam source 802 and beam collimating system 803, an aperture array and condenser lens module 804 including aperture array 805 and condenser lens array 806, a beam switching module 807 including beamlet blanker array 808, and projection optics module 809 including beam stop array 810, beam deflector array 811, and projection lens arrays 812.

The above-mentioned final projection system may refer to the projection lens arrays 812.

The modules may be designed to slide in and out from an alignment frame. In the embodiment shown in FIG. 8, the alignment frame may comprise an alignment inner sub frame 813 and an alignment outer sub frame 814.

In the above flexures have been described for connecting the final projection system with a frame 71. In the FIG. 8, this connection and thus the flexures are not shown. However, the frame 71 may correspond to the alignment inner sub frame 813 or the alignment outer sub frame 814.

A main frame 815 may support the alignment subframes 813 and 814 via vibration damping mounts 816. The wafer or target rests on wafer table 817, which is in turn mounted on chuck 13. For clarity reasons, the wafer table 817 has not been mentioned in the above. Chuck 13 sits on the stage short stroke 818 and long stroke 819. To both the stage short stroke 818 and long stroke 819 is referred to as an actuator system in the above.

The lithography machine may be enclosed in vacuum chamber 820, which may include a mu metal shielding layer or layers 821. The system may rests on base plate 822 and may be supported by frame members 823.

Each module may require a large number of electrical signals and/or optical signals, and electrical power for its operation. The modules inside the vacuum chamber may these signals from a processor unit 824 which is typically located outside of the chamber.

The patterning beam may be collimated by collimator lens system 803. The collimated beam impinges on an aperture array 805, which blocks part of the beam to create a plurality of beamlets, for example at least two beamlets. However, the lithography system may be arranged for generating a large number of beamlets, preferably about 10,000 to 1,000,000 beamlets.

The beamlets may pass through a condenser lens array 806 which may focus the beamlets in the plane of a beam blanker array 808, comprising a plurality of blankers for deflecting one or more of the beamlets.

The deflected and undeflected beamlets may arrive at beam stop array 810, which may have a plurality of apertures. The beamlet blanker array 808 and beam stop array 810 may operate together to block or let pass the beamlets. If beamlet blanker array 808 deflects a beamlet, it will not pass through the corresponding aperture in beam stop array 810, but instead will be blocked. But if beamlet blanker array 808 does not deflect a beamlet, then it will pass through the corresponding aperture in beam stop array 810, and through beam deflector array 811 and projection lens arrays 812. The beam deflector array 811 may provide for deflection of each beamlet in the x and/or y direction, substantially perpendicular to the direction of the undeflected beamlets, to scan the beamlets across the surface of the target.

The beamlets may pass through projection lens arrays 812 and may be projected onto the target. The projection lens arrays 812 preferably provides a demagnification in the order of 25 to 500 times (depending of the specific electron-optical lay out). The beamlets may impinge on the surface of target positioned on moveable chuck 13 for carrying the target. For lithography applications, the target usually is a wafer provided with a charged-particle sensitive layer or resist layer.

The lithography system may operate in a vacuum environment. A vacuum may be desired to remove particles which may be ionized by the beams and become attracted to the source, may dissociate and be deposited onto the machine components, and may disperse the beams. In order to maintain the vacuum environment, the lithography system may be located in a vacuum chamber. All of the major elements of the lithography system are preferably housed in a common vacuum chamber, including the beam source, the optical column and the moveable chuck.

It may be understood that the described embodiment of a lithography system using an electron beam to pattern a target may also be applied to a lithography system using a light beam to pattern a target, mutatis mutandis.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Lithography system for processing a target (23), the target comprising a target surface (12), the lithography system comprising:
   a beam source (802) arranged for providing a charged particle patterning beam (18);
   a final projection system (11) arranged for projecting a pattern on the target surface (12) with said patterning beam;
   a chuck (13) arranged for supporting the target, wherein the chuck comprises a beam measurement sensor (21) arranged on the chuck and a chuck surface provided with at least one position mark in the form of a chuck position mark thereon, the beam measurement sensor being arranged for measuring beam properties of the patterning beam incident on said beam measurement sensor, the beam properties comprising a spatial distribution of an intensity of the patterning beam;
   an actuator system (818,819) arranged for moving the chuck (13) in at least one dimension with respect to the final projection system (11);
   a chuck position sensor system (15), arranged for measuring the position of the chuck with respect to the final projection system (11) in chuck position coordinates; and,
   a mark position system (17) connected to the final projection system (11) and arranged for detecting a position mark (22; 24; 73) on a surface (12),
   a support (63) supporting and connected to the mark position system and the final projection system, wherein the mark position system (17) is connected to the final projection system (11) via said support,
   a frame (71) and at least three flexures (72), wherein the support (63) is connected to the frame via said at least three flexures and is suspended from said frame with the at least three flexures.

2. Lithography system according to claim 1, wherein said support is a support ring (63) supporting both the final projection system (11) and the mark position system (17).

3. Lithography system according to claim 1, wherein a distance between a centre of the beam measurement sensor (21) and the chuck position mark (22) corresponds to a distance (d) between the beam axis (64) of the mark position system and the beam axis (65) of the final projection system (11).

4. Lithography system according to claim 1, wherein
   the beam measurement sensor (21) is further arranged for providing beam properties information based on the measured beam properties of the patterning beam (19);
   the chuck position sensor system (15) is further arranged for providing chuck position information based on a measured position of the chuck (13);
   the mark position system (17) is further arranged for providing mark detection information based on a detected mark (22; 24; 73); and,
   the lithography system further comprises a processing unit arranged for:
   controlling the actuator system (818,819);
   receiving the mark detection information, chuck position information and beam properties information;
   determining the position of the at least one chuck position mark (22) in chuck coordinates;
   determining a spatial distribution of beam properties in chuck coordinates; and,
   determining a spatial distribution of beam properties with respect to the position of the at least one chuck position mark (22).

5. Lithography system according to claim 4, wherein target surface (12) is provided with at least one position mark in the form of a target position mark (24) thereon, and the mark position system (17) is further arranged for detecting the at least one target position mark (24) on the target surface (12),
   wherein the processing unit is further arranged for:
   determining the position of the at least one target position mark (24) in chuck coordinates;
   determining a spatial distribution of beam properties with respect to the position of the at least one target position mark (24) using the spatial distribution of beam properties with respect to the position of the at least one chuck position mark (22); and,
   controlling the projecting of the pattern on the surface (12) using the spatial distribution of beam properties with respect to the position of the at least one target position mark (24).

6. Lithography system according to claim 1, wherein the target surface (12) is provided with at least one position mark in the form of a target position mark (24) thereon, and the mark position system (17) is further arranged for detecting the at least one target position mark (24) on the target surface (12).

7. Lithography system according to claim 6, further comprising said target (23).

8. Lithography system according claim 1, wherein the patterning beam (18) comprises at least two separate patterning beamlets and wherein the beam properties comprises a spatial distribution of the at least two patterning beamlets.

9. Lithography system according claim 1, wherein the at least one chuck position mark comprises four chuck position marks (22).

10. Lithography system according to claim 1, 6, 7 or 5, wherein the mark position system comprises at least one alignment sensor, the alignment sensor being arranged for providing an alignment light beam (403), and for measuring a light intensity of a reflected alignment light beam (409), wherein the reflected alignment light beam is generated by reflection on the surface.

11. Lithography system according to claim 10, wherein the surface is the surface of the at least one chuck position mark, wherein the chuck position mark (22) and/or the target position mark comprises at least a first and a second reflective area, wherein the first reflective area has a higher reflection coefficient than the second reflective area.

12. Lithography system according to claim 11, wherein the alignment sensor is arranged for providing the alignment light beam with a wavelength and at least one of the first and second reflective area comprises structures with dimensions smaller than said wavelength.

\* \* \* \* \*